United States Patent
Iizuka et al.

(10) Patent No.: US 8,476,957 B2
(45) Date of Patent: Jul. 2, 2013

(54) VOLTAGE LEVEL SHIFTER

(75) Inventors: Shinichi Iizuka, Gyunggi-do (KR); Jun Kyung Na, Gyunggi-do (KR); Sang Hoon Ha, Gyunggi-do (KR); Youn Suk Kim, Gyunggi-do (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 0 days.

(21) Appl. No.: 13/309,155

(22) Filed: Dec. 1, 2011

(65) Prior Publication Data

US 2012/0139607 A1 Jun. 7, 2012

(30) Foreign Application Priority Data

Dec. 7, 2010 (KR) .................. 10-2010-0124467

(51) Int. Cl.
*H03L 5/00* (2006.01)

(52) U.S. Cl.
USPC ........................... 327/333; 327/170; 327/541

(58) Field of Classification Search
USPC ............ 327/170, 333, 540, 541, 543; 326/68, 326/80, 81; 365/189.11
See application file for complete search history.

(56) References Cited

U.S. PATENT DOCUMENTS

| | | | | |
|---|---|---|---|---|
| 6,414,537 | B1 * | 7/2002 | Smith | 327/540 |
| 7,501,853 | B2 * | 3/2009 | Ueda | 327/333 |
| 2005/0007189 | A1 * | 1/2005 | Bo et al. | 327/541 |
| 2005/0248391 | A1 * | 11/2005 | Itoh | 327/540 |
| 2007/0001739 | A1 * | 1/2007 | Boerstler et al. | 327/333 |

FOREIGN PATENT DOCUMENTS

| | | |
|---|---|---|
| JP | 06-138961 A | 5/1994 |
| JP | 2000-066744 A | 3/2000 |

* cited by examiner

*Primary Examiner* — Long Nguyen
(74) *Attorney, Agent, or Firm* — McDermott Will & Emery LLP

(57) ABSTRACT

Provided is a voltage level shifter changing an input voltage level and outputting the input voltage. There is provided the voltage level shifter, including: an operational amplifier having a first input having an applied input voltage thereto; a first MOSFET having a gate connected to an output of the operational amplifier, a source having an applied power thereto, and a drain outputting an output voltage; a voltage dividing resistor unit including a plurality of voltage dividing resistors sequentially connected to the drain of the first MOSFET in series, one connection node between the plurality of voltage dividing resistors being connected to the second input of the operational amplifier; and a second MOSFET having a source and a drain, respectively connected to both ends of at least one of the voltage dividing resistors, and a gate connected to the gate of the first MOSFET.

5 Claims, 3 Drawing Sheets

VOLTAGE LEVEL SHIFTER

CROSS-REFERENCE TO RELATED APPLICATIONS

This application claims the priority of Korean Patent Application No. 10-2010-0124467 filed on Dec. 7, 2010, in the Korean Intellectual Property Office, the disclosure of which is incorporated herein by reference.

BACKGROUND OF THE INVENTION

1. Field of the Invention

The present invention relates to an electronic circuit field, and more particularly, to a voltage level shifter changing and outputting an input voltage level.

2. Description of the Related Art

Recently, research into the integration of an analog circuit using complementary metal oxide semiconductor (CMOS) technology and an analog control block controlling the same has been actively progressing. Research into an analog circuit implemented using CMOS technology and into the control block thereof has been conducted, in an effort to reduce the power consumption while reducing a size through simplification of a circuit design.

As a circuit widely used in an analog circuit using CMOS technology, a voltage level shifter has been widely known. A voltage level shifter is a circuit which increases or reduces input voltage at a predetermined ratio, and generates an output voltage by changing the input voltage level.

The voltage level shifter, according to the related art, is configured to include an operational amplifier mainly using an input voltage as one input, a MOSFET, whose gate is connected to the output of the operational amplifier and source and receives a power voltage, and a plurality of resistors connected to a drain of the MOSFET in series.

The voltage level shifter according to the related art has a circuit connection structure that outputs the output voltage to the drain of the MOSFET and feedbacks a divided voltage of the output voltage, divided by the plurality of resistors, to another output of the operational amplifier. The voltage level shifter, according to the related art, may determine the range of fluctuation within a voltage level by the plurality of resistors.

However, when the voltage level shifter according to the related art adjusts the range of fluctuation within the voltage level according to the change in the magnitude of the input voltage, an additional voltage level shifter, having a level fluctuation range of different magnitudes by using the plurality of operational amplifiers, is required.

As described above, the voltage level shifter according to the related art, there is a need for an additional operational amplifier in order to adjust the range of fluctuation within the voltage level, such that the size of the circuit is increased and the power consumption is increased.

SUMMARY OF THE INVENTION

As an aspect of the present invention provides a voltage level shifter capable of adjusting the range of fluctuation within a voltage level without increasing a size of a circuit or power consumption.

According to an aspect of the present invention, there is provided with a voltage level shifter, including: an operational amplifier having a first input having an applied input voltage thereto; a first MOSFET having a gate connected to an output of the first operational amplifier, a source having an applied power thereto, and a drain outputting an output voltage; a voltage dividing resistor unit including a plurality of voltage dividing resistors sequentially connected to the drain of the first MOSFET in series, one connection node between the plurality of voltage dividing resistors being connected to a second input of the operational amplifier; and a second MOSFET having a source and a drain, respectively connected to both ends of at least one of the voltage dividing resistors, and a gate connected to the gate of the first MOSFET.

The voltage dividing resistor unit may include at least three voltage dividing resistors sequentially connected to the drain of the first MOSFET in series.

The position of a slope change of a graph indicating the relationship between the input voltage and the output voltage may be changed according to the position of the voltage dividing resistors connected to the source and the drain of the second MOSFET.

The size of the slope change of the graph indicating the relationship between the input voltage and the output voltage may be changed according to the size of the voltage dividing resistors connected with the source and the drain of the second MOSFET.

The first MOSFET and the second MOSFET may be P channel MOSFETs.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
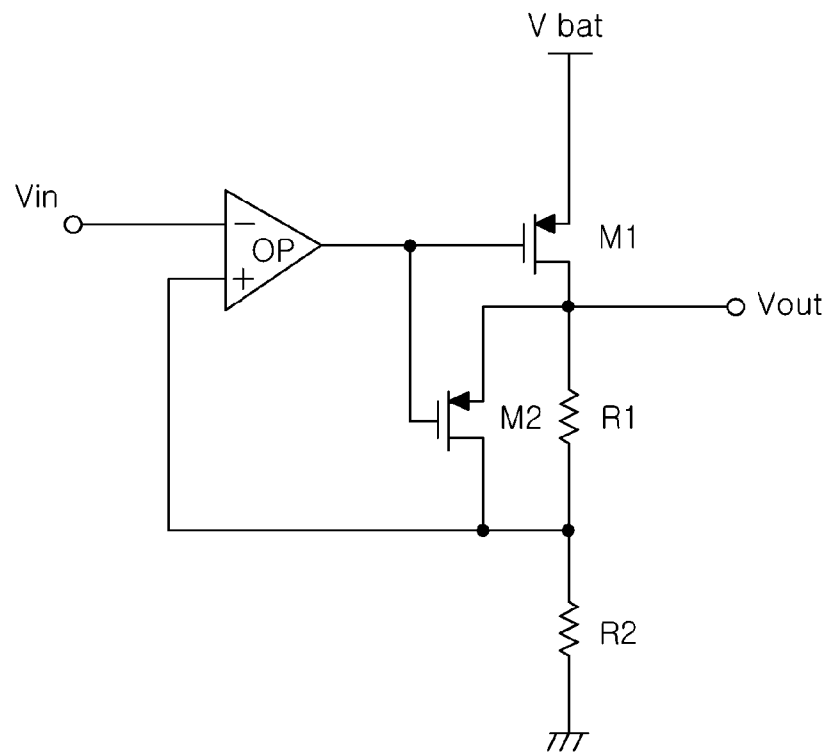
FIG. 1 is a circuit diagram of a voltage level shifter according to an exemplary embodiment of the present invention.

Exemplary embodiments of the present invention will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a circuit diagram of a voltage level shifter according to an exemplary embodiment of the present invention.

As shown in FIG. 1, a voltage level shifter according to an exemplary embodiment of the present invention may be configured to include an operational amplifier OP, two MOSFETs M1 and M2, and voltage dividing resistor units R1 and R2.

In more detail, the operational amplifier OP may have a first input (inverting input), a second input (non-inverting input), and an output. An input voltage Vin of which the voltage level is changed is applied to the first input. A voltage corresponding to an output voltage Vout of which the voltage level is changed is applied to the second input. The voltage applied to the second input may be a voltage that the output voltage Vout is divided into the voltage dividing resistors R1 and R2.

The operational amplifier OP generates an output that can be controlled to equalize the magnitude of two input voltages by comparing the input voltage applied to two inputs with the voltage corresponding to a feedback output voltage. That is, the operational amplifier OP may actually operate as an error amplifier.

The first MOSFET M1 includes a gate connected to the output of the operational amplifier OP, a source having an applied power voltage Vbat thereto, and a drain forming an output voltage Vout of the voltage level shifter.

The first MOSFET M1 reduces the power voltage Vbat applied to the gate by a predetermined amount of level according to the output of the operational amplifier OP applied to the gate thereof and outputs the output voltage Vout to the drain thereof.

When two inputs of the operational amplifier OP are actually equal to each other, the output of the operational amplifier OP is in a low state. In this case, the gate voltage of the first MOSFET M1 is in a low state similar to a ground level and the source voltage thereof is connected to the power voltage Vbat to be in a very high state, such that the source-gate voltage of the first MOSFET M1 may be is in a state larger than its own threshold voltage Vth. Thereby, the first MOSFET M1 is in a turn-on state. The first MOSFET M1 serves as a given resistor connected between a source and a drain thereof.

For the above-mentioned operation, as the first MOSFET M1, a P channel MOSFET may be used.

The voltage dividing resistor units R1 and R2 divides the output voltage Vout by using the voltage dividing resistors R1 and R2 and provides the divided voltage to one input of the operational amplifier OP.

For example, when the second MOSFET M2 is turned-off, the voltage dividing resistor units R1 and R2 may be configured to include two resistors, such as a first resistor R1 and a second resistor R2. The first and second voltage dividing resistors R1 and R2 may be connected in series between the drain of the first MOSFET M1 and the ground. The connection node of the first and second voltage dividing resistors R1 and R2 is connected to a second input of the operational amplifier OP.

Through the connection structure, the first and second voltage dividing resistors R1 and R2 divide the output voltage Vout according to the resistance value and provide it.

The voltage difference between two inputs is 0 due to the characteristics of a virtual ground of the operational amplifier OP, such that the voltage divided by the first and second voltage dividing resistors R1 and R2 has the same value as the input voltage.

That is, the input voltage Vin may be expressed by the following Equation 1 and the output voltage Vout by the following Equation 1 may be determined by the following Equation 2. Equation 1;

$$Vin = \frac{R2}{R1 + R2} \times Vout$$

Equation 2;

$$Vout = \frac{R1 + R2}{R2} \times Vin$$

That is, the voltage level shifter according to the exemplary embodiment of the present invention shown in FIG. 1 may output the output voltage Vout provided by shifting the input voltage by Vin (R1+R2)/R2 times when the second MOSFET M2 is turned-off.

The second MOSFET M2 has a source and a drain respectively connected to both ends of at least one resistor R1 of the voltage dividing resistors and has a gate connected to the gate of the first MOSFET M1.

When the level of the input voltage Vin is in a low state, the second MOSFET M2 is turned-off. As the input voltage Vin is increased, the output voltage Vout is also increased by the above Equation 2.

When the output voltage Vout is increased, the difference between the source voltage and the drain voltage of the first MOSFET M1 is reduced while the drain voltage of the first MOSFET M1 rises. That is, the source-drain resistance of the first MOSFET M1 is reduced, such that the gate voltage of the first MOSFET M1 falls.

The gate voltage of the first MOSFET M1 falls and the gate voltage of the second MOSFET M2 connected to the same node falls accordingly. If the source-gate voltage of the second MOSFET M2 is larger than the threshold voltage of the second MOSFET M2 due to the falling of the gate voltage of the second MOSFET M2, the second MOSFET M2 is turned-on to serve as a resistor connected in parallel with the first voltage dividing resistor R1.

In order to implement the operational of the second MOSFET M2, as the second MOSFET M2, the P channel MOSFET may be applied.

If the resistor formed by turning the second MOSFET M2 on is RM, the value of the output voltage is as the following Equation 3 when the second MOSFET M2 is turned-on. Equation 3;

$$Vout = \frac{(R1 // RM) + R2}{R2} \times Vin$$

The resultant resistance value formed by the second MOSFET M2 and the first voltage dividing resistor R1 connected thereto in parallel is smaller than that of the first voltage dividing resistor R1. Therefore, referring to Equation 3, after the second MOSFET M2 is turned-on, the degree of alteration change in the input voltage Vin is further reduced. These characteristics are shown in FIG. 2.

Figure 2:
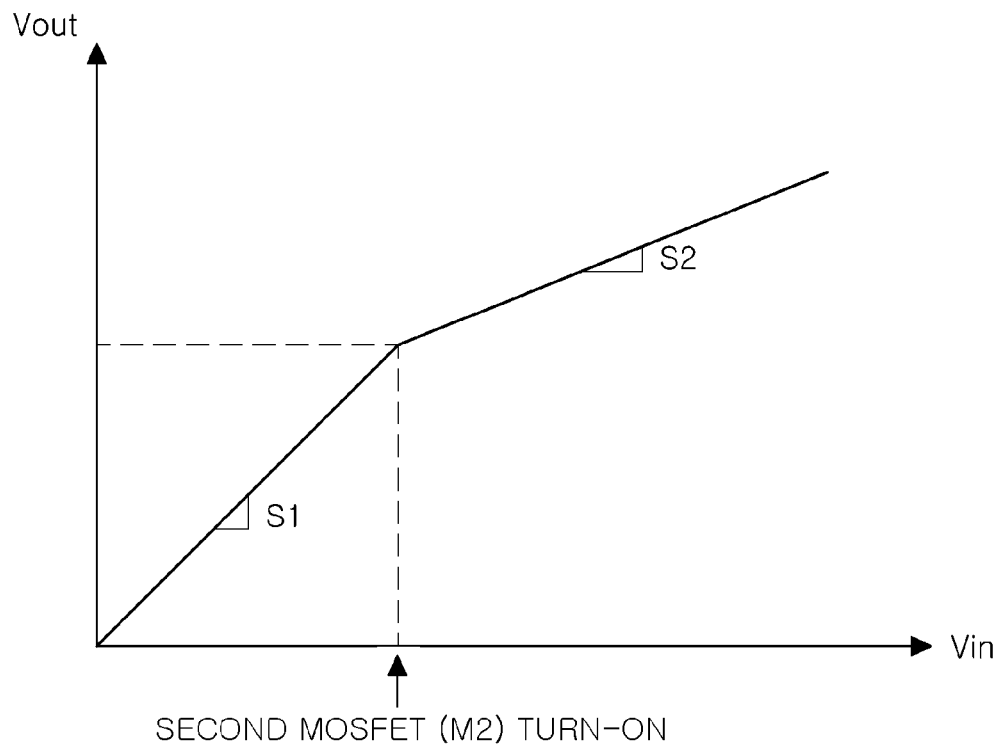
FIG. 2 is a graph showing a relationship between an input voltage and an output voltage of the voltage level shifter according to the exemplary embodiment of the present invention.

FIG. 2 is a graph showing a relationship between the input voltage and the output voltage of the voltage level shifter according to the exemplary embodiment of the present invention.

As shown in FIG. 2, before the second MOSFET M2 is turned-on, the output voltage Vout is increased according to a slope S1=(R1+R2)/R2 indicated by the above Equation 2.

When the second MOSFET M2 is turned-on, the output voltage Vout is increased according to a slope S2=((R1//RM)+R2)/R2 provided by the resultant resistance of the resistor RM due to the first voltage dividing resistor R1 and the second MOSFET M2 connected thereto in parallel.

Since the resistance value of the resultant resistance of the resistor RM due to the first voltage dividing resistor R1 and the second MOSFET M2 connected thereto in parallel is smaller than that of the first voltage dividing resistor R1, the slope S2 after the second MOSFET M2 is turned-off is smaller than the slope S1 before the second MOSFET M2 is turned-on.

As described above, according to the exemplary embodiment of the present invention, the relationship between the input and output voltages of the voltage level shifter may be adjusted by adding only the MOSFET.

Meanwhile, according to the exemplary embodiment of the present invention, the number of voltage dividing resistors or the connection position of the source/drain of the second MOSFET may be adjusted, thereby adjusting the timing when the relationship of the input and output voltage is changed or the changed slope.

Figure 3:
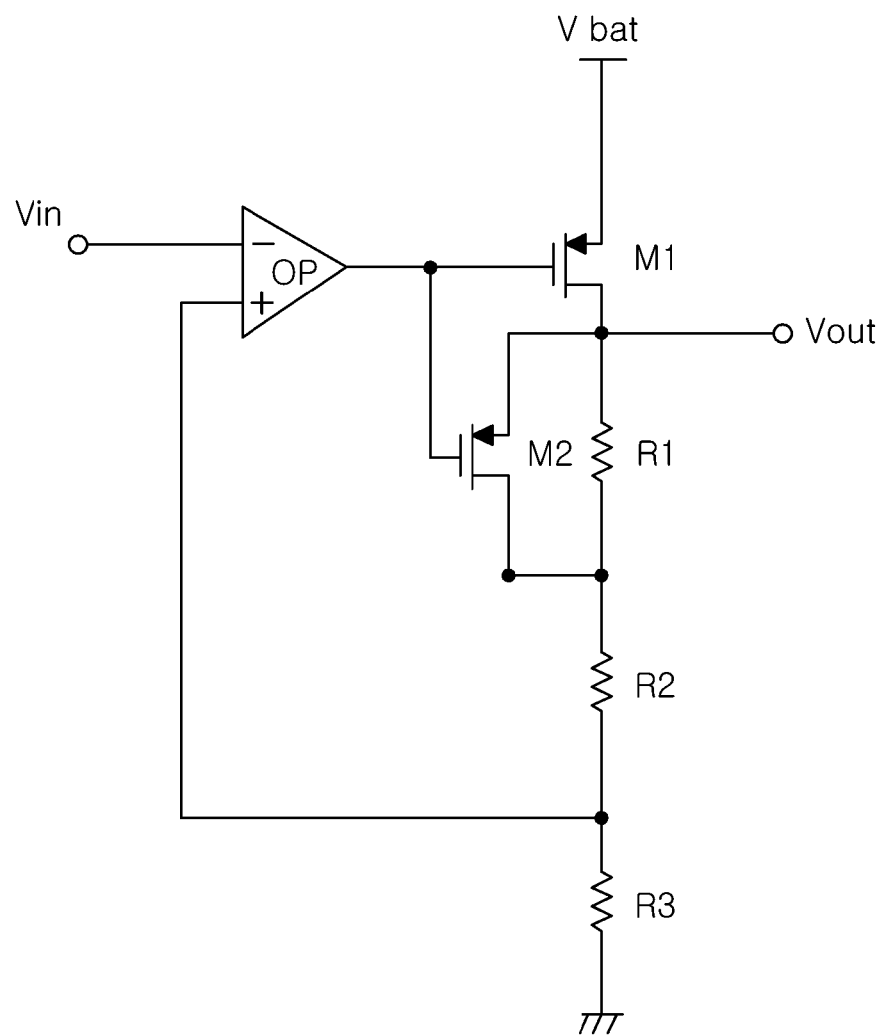
FIGS. 3 and 4 are circuit diagrams of the voltage level shifter according to various exemplary embodiments of the present invention.
Figure 4:
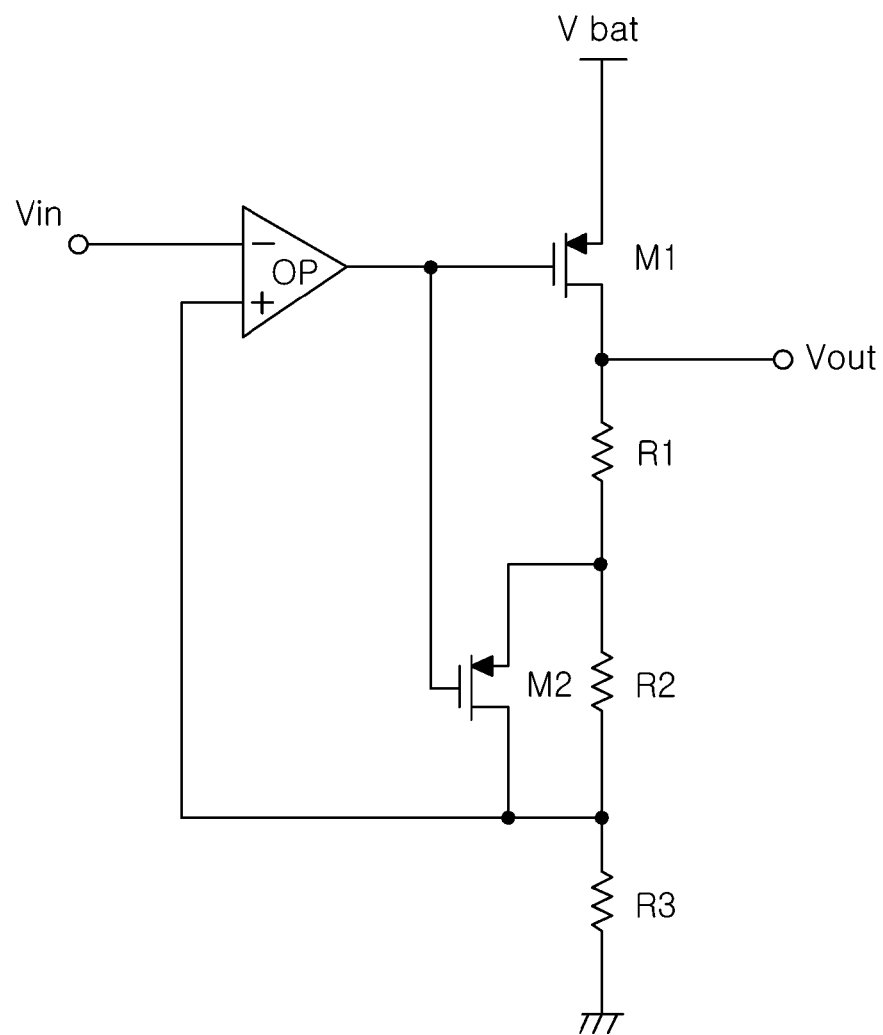

FIGS. 3 and 4 are circuit diagrams of the voltage level shifter according to various exemplary embodiments of the present invention. FIGS. 3 and 4 show a circuit in which the connection position of the source/drain of the second MOSFET M2 is changed in the circuit using the same three voltage dividing resistors.

FIG. 3 shows an example in which the second MOSFET M2 is connected to the first voltage dividing resistor R1 directly connected to the drain of the first MOSFET M1 outputting the output voltage Vout, and FIG. 4 shows an example in which the second MOSFET M2 is connected to the second voltage dividing resistor R2 connected between the first voltage dividing resistor R1 and the third voltage dividing resistor R3.

In all of the circuits shown in FIGS. 3 and 4, the connection node of the second voltage dividing resistor R2 and the third voltage dividing resistor R3 is connected to one of the inputs of the operational amplifier OP.

In the circuit shown in FIG. 3, the source of the second MOSFET M2 is connected to the output voltage, and in the circuit shown in FIG. 4, the source of the second MOSFET M2 is connected to the connection node of the first voltage dividing resistor R1 and the second voltage dividing resistor R2. Due to the connection relationship, in the circuit of FIG. 4, the node connected to the source of the second MOSFET M2 has applied voltage lower than the output voltage Vout.

Therefore, as the gate voltage of the second MOSFET M2 falls, the source-gate voltage of the second MOSFET M2 of the circuit shown in FIG. 3 becomes larger than the threshold voltage of the MOSFET, prior to the application of the source-gate voltage of the second MOSFET M2.

That is, in the graph showing the relationship between the input and output voltage, the circuit of FIG. 2 forms the timing when the slope is changed, prior to the application of the circuit of FIG. 3.

As described above, according to the embodiment of the present invention, the position of the voltage dividing resistor providing the connection of the second MOSFET may be adjusted, thereby adjusting the timing when the slope is changed in the graph showing the input and output voltage relationship.

Meanwhile, as shown in FIGS. 3 and 4, in the example of using three voltage dividing resistors, when the resultant resistance value of the first voltage dividing resistance R1 and the second voltage dividing resistance R2 is constantly maintained, the ratio of the output voltage Vout divided through the relationship with the third voltage dividing resistor R3 may be constantly maintained.

Therefore, in the circuit shown in FIGS. 3 and 4, the magnitude in the slope change may be adjusted in the graph showing the relationship between the input and output voltages by adjusting the value of the first voltage dividing resistor R1 and the second voltage dividing resistor R2 when the resultant resistance value of two resistors are constantly maintained.

As described above, according to the exemplary embodiment of the present invention, the voltage level shifter having various input and output relationship may be implemented by adjusting the number of voltage dividing resistors and the position of voltage dividing resistor connected to the source/drain of the second MOSFET.

As set forth above, according to the exemplary embodiment of the present invention, the range of fluctuation within the voltage level of the voltage level shifter and timing when the voltage level thereof is fluctuated may be controlled, by simply adding the MOSFET.

Further, according to the exemplary embodiment of the present invention, the size of the circuit or the power consumption may be prevented from increasing, when the range of fluctuation within the voltage level of the voltage level shifter is adjusted.

While the present invention has been shown and described in connection with the exemplary embodiments, it will be apparent to those skilled in the art that modifications and variations can be made without departing from the spirit and scope of the invention as defined by the appended claims.

What is claimed is:

1. A voltage level shifter, comprising:
an operational amplifier having a first input having an applied input voltage thereto;
a first MOSFET having a gate connected to an output of the operational amplifier, a source having applied power thereto, and a drain outputting an output voltage;
a voltage dividing resistor unit including a plurality of voltage dividing resistors sequentially connected to the drain of the first MOSFET in series, one connection node between the plurality of voltage dividing resistors being connected to a second input of the operational amplifier; and
a second MOSFET having a source and a drain, respectively connected to both ends of at least one of the voltage dividing resistors, and a gate connected to the gate of the first MOSFET.

2. The voltage level shifter of claim 1, wherein the voltage dividing resistor unit includes at least three voltage dividing resistors sequentially connected to the drain of the first MOSFET in series.

3. The voltage level shifter of claim 2, wherein a position of the voltage dividing resistor connected with the source and the drain of the second MOSFET determines a position of a slope change of a graph indicating the relationship between the input voltage and the output voltage.

4. The voltage level shifter of claim 2, wherein the size of the slope change of the graph indicating the relationship between the input voltage and the output voltage is changed according to the size of the voltage dividing resistors connected with the source and the drain of the second MOSFET.

5. The voltage level shifter of claim 1, wherein the first MOSFET and the second MOSFET is P channel MOSFETs.

* * * * *